United States Patent [19]

Gilmore et al.

[11] 4,361,717

[45] Nov. 30, 1982

[54] FLUID COOLED SOLAR POWERED PHOTOVOLTAIC CELL

[75] Inventors: Robert S. Gilmore, Burnt Hills; Homer H. Glascock, II; Harold F. Webster, both of Scotia, all of N.Y.

[73] Assignee: General Electric Company, Schenectady, N.Y.

[21] Appl. No.: 213,259

[22] Filed: Dec. 5, 1980

[51] Int. Cl.³ .......................................... H01L 31/06
[52] U.S. Cl. ................................... 136/246; 136/255; 136/256; 136/259; 136/248; 357/81; 357/82
[58] Field of Search ............... 136/246, 248, 259, 256; 357/81, 82

[56] References Cited

U.S. PATENT DOCUMENTS

| | | | |
|---|---|---|---|
| 2,963,390 | 12/1960 | Dickson, Jr. | 148/1.5 |
| 3,128,419 | 4/1964 | Waldkotter et al. | 357/81 |
| 3,295,089 | 12/1966 | Moore | 338/204 |
| 3,609,476 | 9/1971 | Storm | 357/68 |
| 3,833,425 | 9/1974 | Leinkram et al. | 136/246 |
| 4,133,698 | 1/1979 | Chiang et al. | 136/255 |
| 4,180,414 | 12/1979 | Diamond et al. | 136/246 |
| 4,209,347 | 6/1980 | Klein | 136/246 |
| 4,249,959 | 2/1981 | Jebens | 136/244 |
| 4,252,263 | 2/1981 | Houston | 228/193 |

Primary Examiner—Aaron Weisstuch
Attorney, Agent, or Firm—Donald R. Campbell; James C. Davis, Jr.; Marvin Snyder

[57] ABSTRACT

Concentrated sunlight impinges on a large area photovoltaic device which is bonded to a highly pliable and thermally and electrically conductive structured copper strain relieving member; the lower face of the structured copper is sealed to a fluid cooled metal heat sink. Large power densities of sunlight are absorbed without appreciable temperature rise. The structured copper accommodates to the difference in expansion between the metal heat sink and the semiconductor wafer. Three embodiments utilize a single planar junction diode, an interdigitated diode, and series connected isolated junction diodes.

6 Claims, 10 Drawing Figures

FLUID COOLED SOLAR POWERED PHOTOVOLTAIC CELL

BACKGROUND OF THE INVENTION

This invention relates to fluid cooled photovoltaic cells which can absorb large power densities of sunlight without appreciable temperature rise and consequent loss of efficiency.

Since sunlight is a dilute power source, 1 kilowatt/meter$^2$, it is necessary to collect it over a large area if the power needs of a home or a community are to be met. Semiconducting devices are more expensive than solar collectors, on a unit area basis, so there is economic advantage in concentrating the sunlight before it impinges on a photovoltaic cell. Because the efficiency of the cell falls off at elevated temperatures, it is necessary to use either low concentration levels or efficient cooling methods. The prior art does not deal adequately with the cooling of devices, especially large area devices, which are receiving solar power at concentration levels near 10$^3$.

SUMMARY OF THE INVENTION

A photovoltaic device exposed to highly concentrated sunlight is terminated with a highly thermally and electrically conducting member that is fluid cooled. A structured copper strain relieving member, comprised of substantially parallel closely packed strands of copper of approximately equal length, is bonded to the metal heat sink and accommodates the differences in expansion of the heat sink (copper) and the semiconductor wafer or an intermediate insulating wafer. The fluid cooled photovoltaic device is held at a relatively low temperature so as to maintain the efficiency of solar power to electrical power efficiency.

One embodiment has a junction diode solar cell with a diameter greater than one inch; the silicon wafer is bonded to the top surface of the structured copper disk. Another embodiment, rather than having a single planar junction, has interdigitated fingers of n-type and p-type semiconductor in the lower face of the device. One set of semiconductor fingers and metallizations is elevated above the other set, making it possible to bond the structured copper member to one set only for cooling purposes. A third embodiment has separate devices which are connected in series to yield higher voltage and are electrically isolated. The semiconductor wafers are pie-shaped or are rectangular and assembled in a matrix. An insulating wafer with a patterned metallic layer on one surface and a continuous metallic layer on the other surface is bonded between the devices and the structured copper member for electrical isolation. In this case the structured copper functions as an expansion interface between the metal heat sink and the insulating wafer.

DESCRIPTION OF THE PREFERRED EMBODIMENTS

Figure 1:
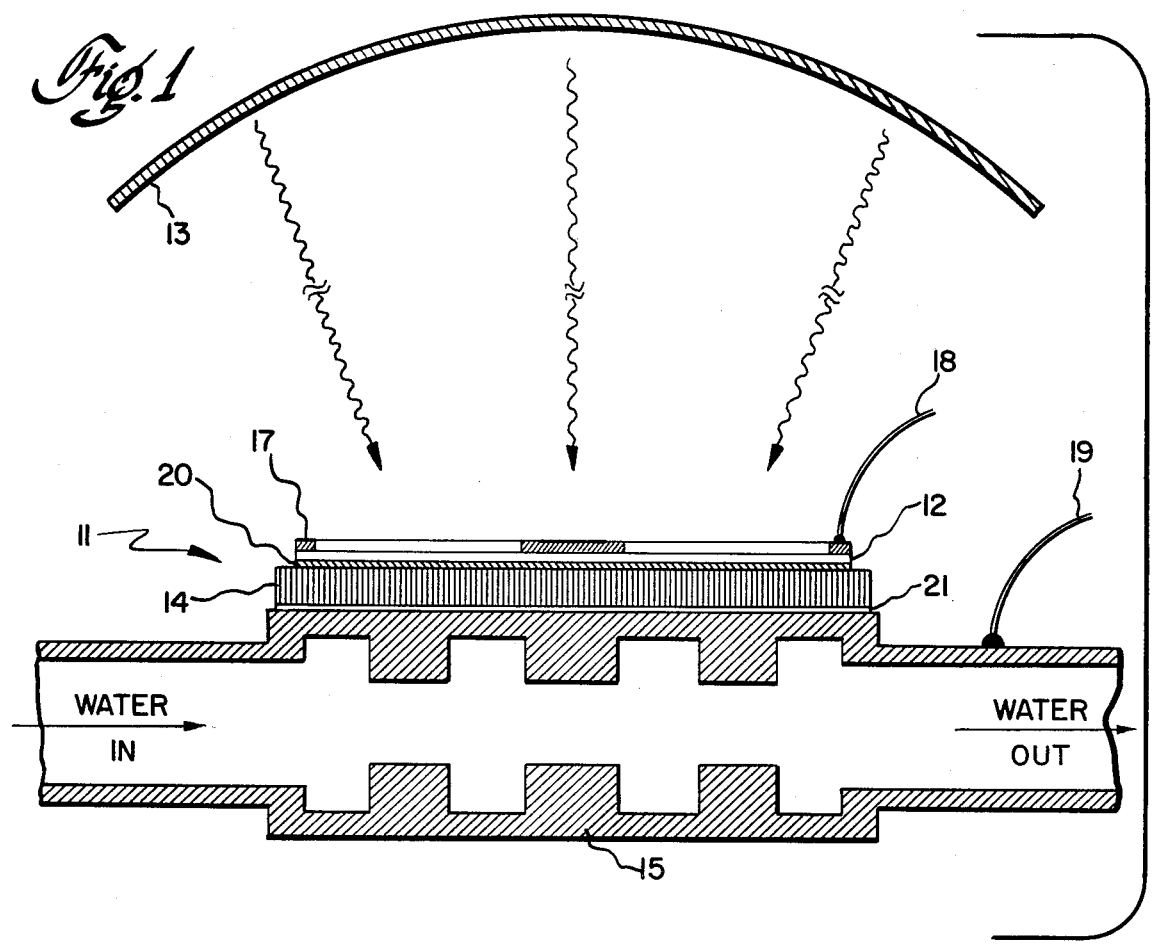
FIG. 1 is a cross section of a sunlight concentrating mirror and a kilowatt level water cooled silicon junction diode solar cell.
Figure 2:
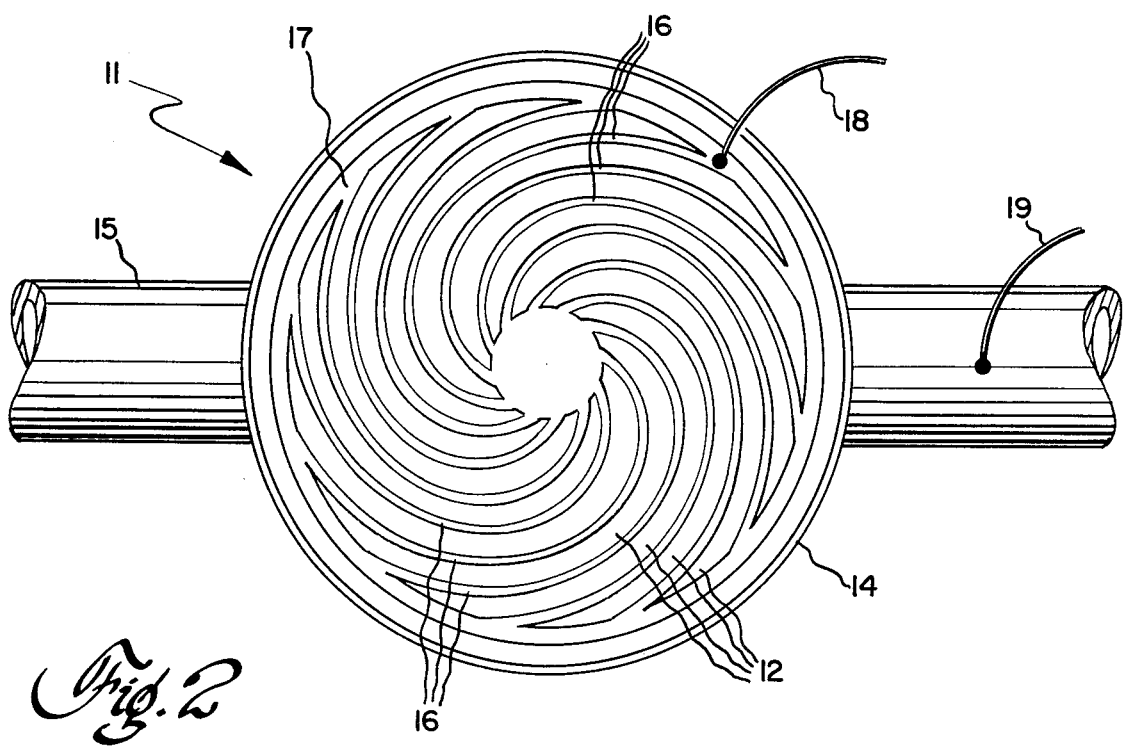
FIG. 2 is a top view of the photovoltaic device in FIG. 1 showing the involute finger contact.

In FIG. 1, a water cooled photovoltaic device 11 has a two-inch diameter silicon junction diode solar cell 12 which is maintained at a relatively low temperature while it absorbs a large power level of sunlight. This is a big device capable of generating a large amount of power. Highly concentrated sunlight, designated by the arrows, impinges on the surface of the junction diode. The concentrator is a mirror 13 which focuses sunlight onto solar cell 12 at a power density of 1000 kilowatts/meter$^2$, the equivalent of 1000 suns. Solar cell 12 is sealed to a highly pliable, highly electrically and thermally conducting material, structured copper disk 14, which is formed of substantially parallel strands of copper at a density near 90 percent and is in turn sealed to a liquid cooled copper heat sink 15. Highly conducting or very thin layer joining techniques are used throughout. The structured copper member accommodates to the difference in expansion between the copper heat sink and silicon wafer. The multi-legged top contact copper grid on silicon wafer 12, FIG. 2, includes a number of thin involute fingers 16 that join at the center and connect to a ring 17 at the periphery of the wafer. The metallization pattern has on the order of eight to twelve legs. One device lead 18 is soldered to this ring and the other device lead 19 to the copper heat sink. On the bottom surface of silicon wafer 12 is a continuous base metallization 20. These metallizations are palladium-silver or chrome-nickel-copper, and others are possible. Although wafer 12 has a large diameter, greater than one inch and up to two inches or more, there is a single planar pn or np junction in the silicon. The ability to carry currents on the order of 100 amperes is needed for a two inch diameter device.

Typically, one end of the copper wires in structured copper strain relieving disk 14 is thermo-compression bonded to a copper foil disk 21. The foil is joined to and diffused into a common end of the bundle of copper strands. This process and the structured copper member itself are described in allowed application Ser. No. 139,177 filed Apr. 11, 1980 now U.S. Pat. No. 4,252,263, D. E. Houston, "Method and Apparatus for Diffusion Bonding a Metallic Foil to Structured Copper", assigned to the same assignee. It is desirable to use strands of copper which have oxidized surfaces so as to help avoid having the strands of copper stick together. Prior to placing in the diffusion bonding press, the foil is cleaned and also the surface of the structured copper disk which must be free of oxide. The upper free ends of the copper wires are bonded directly to solar cell metallization 20, and are free to adjust to the different thermally induced expansions of silicon wafer 12 and copper heat sink 15. Soldering, brazing, or thermo-compression bonding may be utilized, but the temperature should not exceed 400° C. unless the parts are heated briefly. Any of these three bonding techniques can be employed to bond copper foil 21 to heat sink 15.

The expansion of copper is approximately six times that of silicon, and thus the need for an expansion interface. Structured copper disk 14 exhibits substantial structural integrity while still allowing individual movement of the separate strands of copper in the plane of the disk so as to provide substantial stress relieving capability together with high thermal conductivity. The structured copper disk provides a good electrical connection to the junction diode while also providing a good thermal path away from the device for heat generated by the device. Thermally induced expansions and contractions of the photovoltaic cell occur when clouds pass over as well as at the beginning and end of the day.

Figure 3:
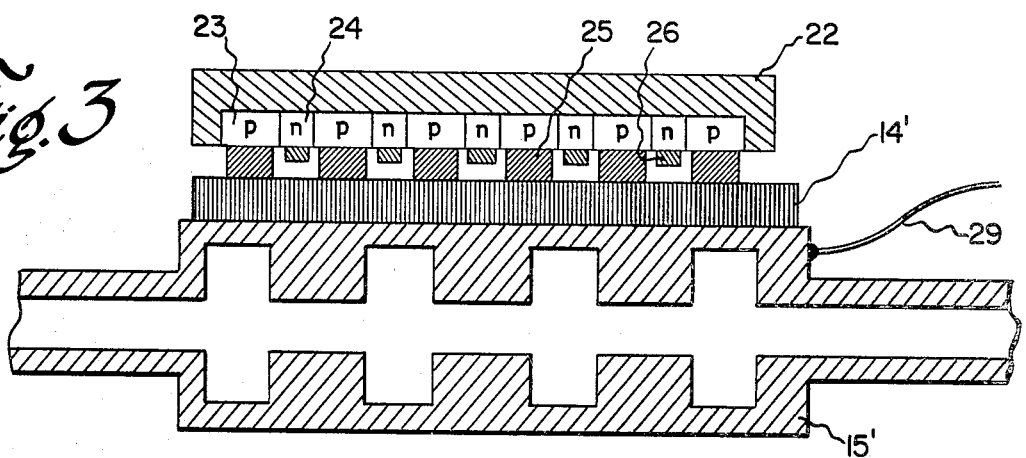
FIG. 3 is a fragmentary cross section of a second embodiment which has a solar cell with interdigitated fingers of p and n silicon on the lower face.
Figure 4:
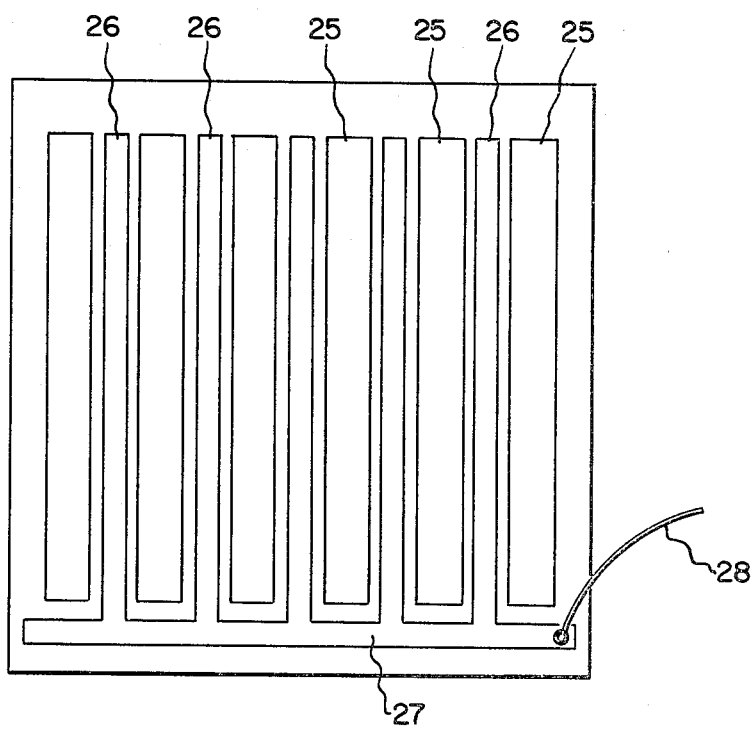
FIG. 4 is a plan view of the interdigitated p and n region metallizations.
Figure 5:
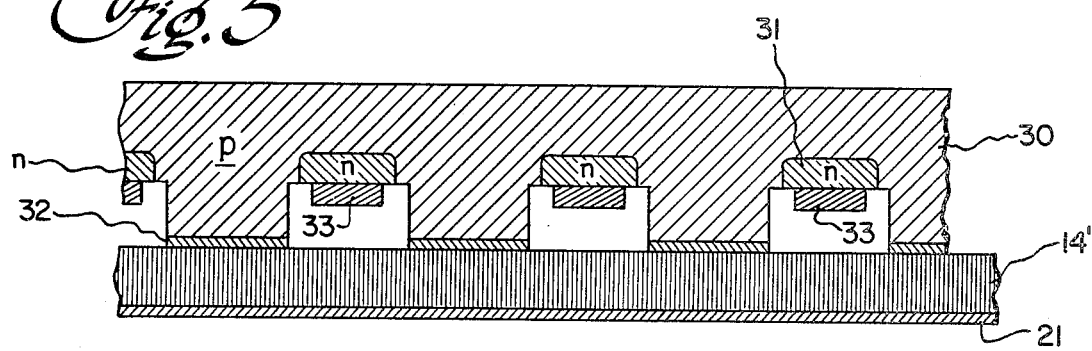
FIG. 5 is a fragmentary cross section of an alternative to the solar cell and contact structure in FIG. 3.

The second embodiment of the invention illustrated in FIGS. 3-5 has interdigitated fingers of n-type and p-type silicon on the lower face of the solar cell. By elevating one set of contact metallizations or one set of fingers several mils above the surface plane of the other, it is possible to bond structured copper to one set only for cooling purposes. Square silicon wafer 22 has in its lower surface elongated, interdigitated fingers 23 and 24 of p-type and n-type silicon, and on these regions are alternating thick and thin metallization strips 25 and 26. The thin n region contacts 26 are all interconnected at one end by a metallization 27 to which one device lead 28 is attached. The other set of thick p region contacts 25 are soldered or bonded directly to the top top surface of square structured copper strain relieving member 14'. The lower surface of the latter is soldered or bonded to liquid cooled copper heat sink 15' to which the second device lead 29 is attached. The thickness of the structured copper member for this and the other configurations is typically 100 mils.

FIG. 5 shows an alternative solar cell structure. The lower face of p-type silicon wafer 30 is grooved and the n-type semiconductor fingers 31 are diffused or ion implanted in the bottom of every groove. The p and n region contacts 32 and 33 are both thin metallizations, and the former are bonded to the top of structured copper strain relieving member 14'. As was explained, the lower ends of the copper wires are thermo-compression bonded to copper foil 21. The cooling fluid, instead of water, in some cases may be liquid refrigerant or forced air. One set of the interdigitated semiconductor fingers, the n-type fingers in this case, are air cooled. Gallium arsenide photovoltaic cells may be substituted for the silicon devices in this and the next embodiment.

Figure 6:
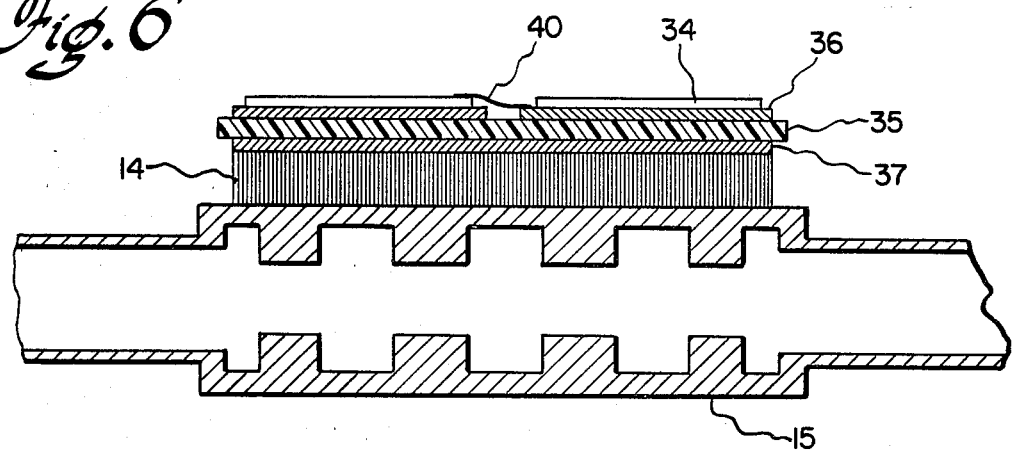
FIG. 6 is a cross section of a third form of the fluid cooled photovoltaic device which has pie-shaped cells connected in series.
Figure 7:
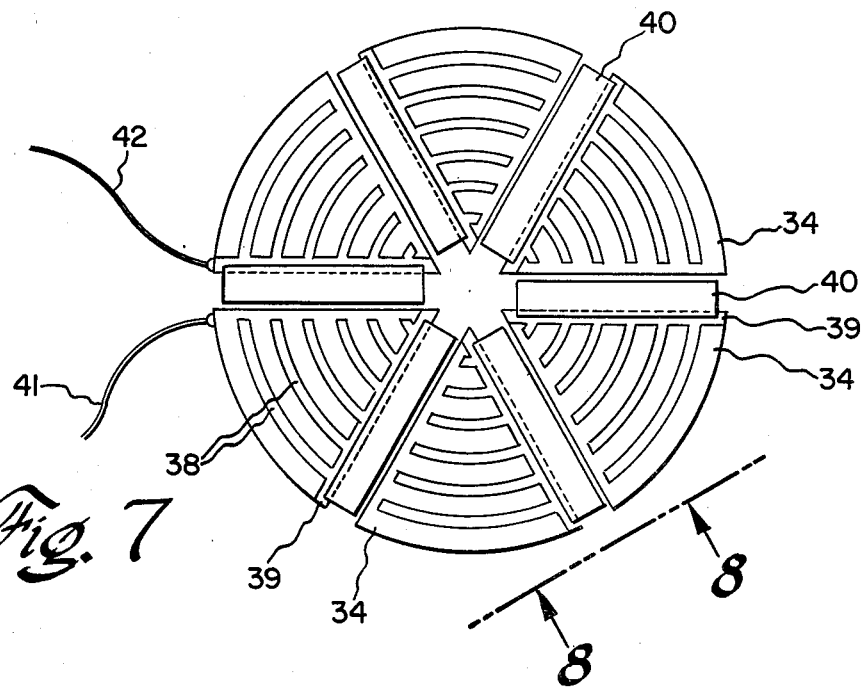
FIG. 7 is a top view of the foregoing device and the arcuate finger metallization.
Figure 8:
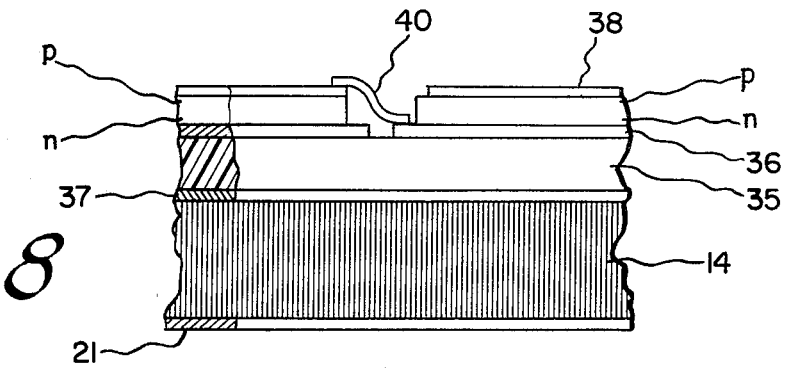
FIG. 8 is a side view and cross section taken approximately on line 8—8 in FIG. 7 illustrating the series connection of cells.

In FIGS. 6-8, pie-shaped junction diode solar cells 34 are connected in series to yield higher voltage and must be electrically isolated. Here a layer 35 of beryllium oxide, BeO, with a suitable patterned direct bonded copper sheet 36 on one surface and planar copper sheet 37 on the other is sealed between cells 34 and structured copper member 14. Alternatively, the insulating layer is alumina. Information on such a bonded structure and the direct bonding process is given in U.S. Pat. No. 3,993,441 and others assigned to the instant assignee. The top metallization grid on every solar cell 34 includes several arcuate fingers 38 at successively different radii which all intersect a strip 39 at one edge of the wafer. The pie-shaped wafers 34 are bonded to isolated areas of patterned metallic layer 36 and the cells are connected in series by means of conductive straps 40 which extend between the conductive strip 39 on the top of one cell and the metallic layer 36 on which the next cell is bonded. The device lead 41 is attached to the copper layer 36 under the first cell and device lead 42 is attached to the conductive strip 39 on the light-receiving surface of the last cell in the series. Structured copper strain relieving disk 14 is bonded to the continuous metallic layer 37 on the lower surface of insulating layer 35.

Figure 9:
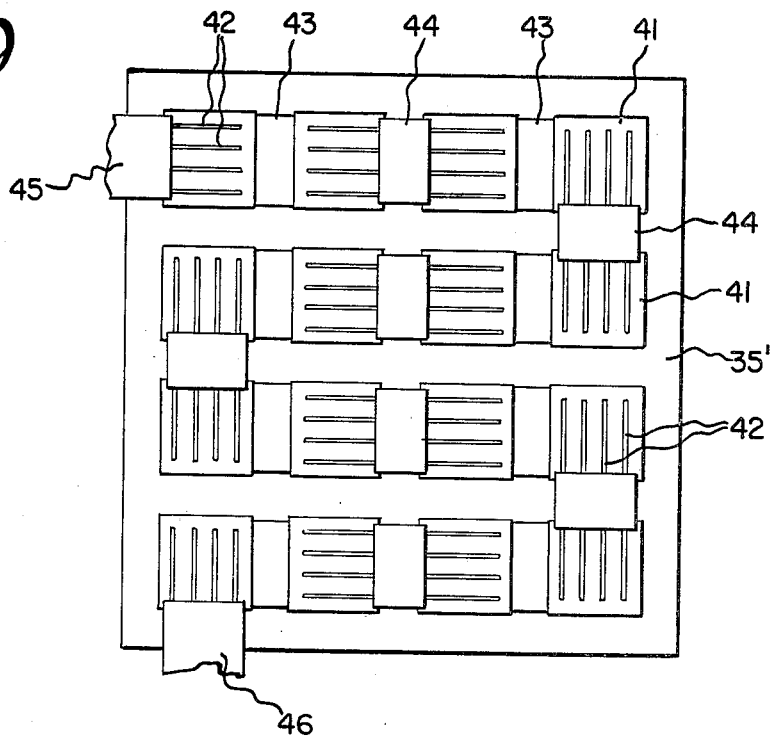
FIG. 9 is an alternative to FIG. 6 and is a top view of a matrix of series connected junction diodes.
Figure 10:
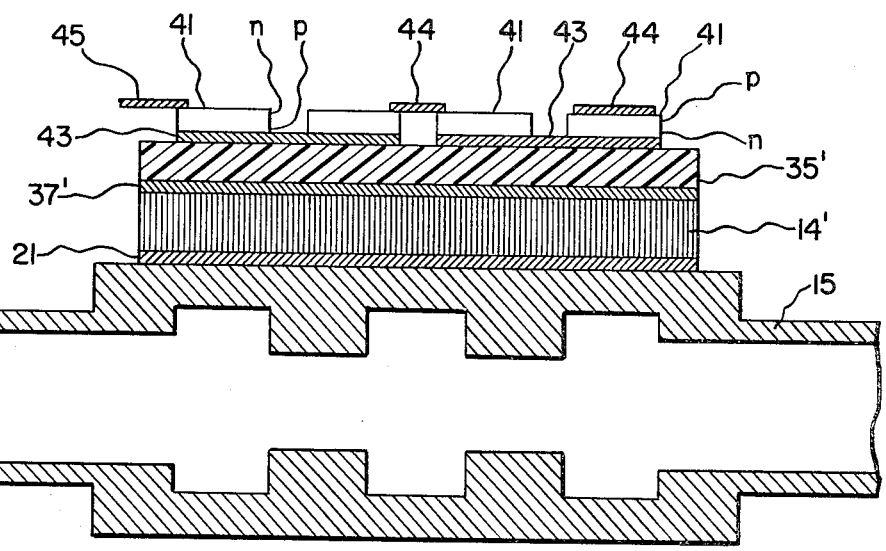
FIG. 10 is a typical cross section through the matrix.

The fluid cooled photovoltaic device diagrammed in FIGS. 9 and 10 is a modification of the foregoing and has a matrix of square or rectangular junction diode solar cells 41 which are connected in series to yield higher voltage. The anodes and cathodes of adjacent cells 41 are reversed and one way of effecting the series connection is illustrated. The top electrode grid on every solar cell is comprised of thin parallel fingers 42 that are interconnected at one common end. The bonded metallic layer on the top surface of insulating wafer 35' is patterned to have rectangular islands 43 to which are bonded two semiconductor wafers 41, one with an pn junction and the other with an np junction. Conductive straps 44 connect together the top metallizations of adjacent cells. The device leads are indicated at 45 and 46. Structured copper member 14' is bonded to the continuous direct bonded metallic layer 37' and to copper heat sink 15. The function of structured copper member 14' is to provide a good thermal path for heat generated by the matrix of solar cells, and in this case accommodate to the difference in expansion between the copper and insulating wafer 35'. The expansion of beryllium oxide and silicon are closer together than the expansion of copper and silicon.

In conclusion, large power levels of sunlight are absorbed by these fluid cooled photovoltaic devices without heating up excessively or losing efficiency. These are big devices capable of generating large amounts of power.

While the invention has been particularly shown and described with reference to several preferred embodiments thereof, it will be understood by those skilled in the art that various changes in form and details may be made therein without departing from the spirit and scope of the invention.

The invention claimed is:

1. A fluid cooled photovoltaic device which converts concentrated sunlight into electrical energy comprising:
   a semiconductor wafer in the lower face of which is formed an interdigitated solar cell having alternating fingers of p-type and n-type semiconductor on each of which is a metallization, one set of semiconductor fingers and metallizations being elevated above the other set of fingers and metallizations;
   a fluid cooled metal heat sink;
   device leads connected to the metallizations on said one set of elevated semiconductor fingers and to said metal heat sink;
   a structured copper strain relieving member having one surface bonded to the metallizations on said other set of semiconductor fingers and the opposing surface bonded to said metal heat sink;
   said structured copper member being comprised of substantially parallel closely packed strands of copper approximately equal length, and highly thermally and electrically conductive and pliable so as to accommodate to the difference in expansion between said metal heat sink and semiconductor wafer.

2. The photovoltaic device of claim 1 wherein the metallizations on said p-type and n-type semiconductor fingers are of different thicknesses whereby one set is elevated above the other.

3. The photovoltaic device of claim 1 wherein the bottom surface of said semiconductor wafer is grooved and the opposite conductivity type semiconductor finger is a diffused or ion implanted region in the bottom of every groove.

4. The photovoltaic device of claim 1 wherein at one end of said structured copper member the strands of copper are thermo-compression bonded to a metallic foil which in turn is bonded to said heat sink.

5. A fluid cooled photovoltaic device which converts concentrated sunlight into electrical energy comprising:
- a plurality of pie-shaped semiconductor wafers in each of which is formed a junction diode solar cell;
- an insulating wafer having on one surface a patterned metallic layer and on the opposing surface a continuous metallic layer;
- means bonding said pie-shaped semiconductor wafers to isolated areas of said patterned metallic layer;
- each solar cell having a top metallization, and means including conductive straps between the top metallization on one cell and the patterned metallic layer under the next cell for connecting said solar cells in series;
- a fluid cooled metal heat sink;
- a structured copper strain relieving member comprised of substantially parallel closely packed strands of copper of approximately equal length, and highly thermally and electrically conductive and pliable so as to accommodate to the difference in expansion between said metal heat sink and insulating wafer, said strands of copper being bonded directly to said continuous metallic layer on said insulating wafer and, at the other end, thermo-compression bonded to a metallic foil disk which in turn is bonded to said heat sink.

6. A fluid cooled photovoltaic device which converts concentrated sunlight into electrical energy comprising:
- a plurality of rectangular semiconductor wafers in each of which is formed a junction diode solar cell;
- an insulating wafer having on one surface a patterned metallic layer and on the opposing surface a continuous metallic layer;
- means bonding said semiconductor wafers in a matrix arrangement to isolated areas of said patterned metallic layer;
- each solar cell having a top metallization and means including conductive straps between the top metallizations of adjacent cells for connecting said solar cells in series;
- a fluid cooled metal heat sink;
- a structured copper strain relieving member comprised of substantially parallel closely packed strands of copper of approximately equal length, and highly thermally and electrically conductive and pliable so as to accommodate to the difference in expansion between said metal heat sink and insulating wafer, said strands of copper being bonded directly to said continuous metallic layer on said insulating wafer and, at the other end, thermo-compression bonded to metallic foil which in turn is bonded to said heat sink.

* * * * *